(12) United States Patent
Talmer

(10) Patent No.: US 9,859,140 B2
(45) Date of Patent: Jan. 2, 2018

(54) FAST SWAP DUAL SUBSTRATE TRANSPORT FOR LOAD LOCK

(75) Inventor: Mark A. Talmer, Westford, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 13/561,873

(22) Filed: Jul. 30, 2012

(65) Prior Publication Data

US 2013/0028689 A1    Jan. 31, 2013

Related U.S. Application Data

(63) Continuation of application No. 12/148,346, filed on Apr. 18, 2008, now Pat. No. 8,231,322, which is a continuation of application No. 11/104,397, filed on Apr. 12, 2005, now Pat. No. 7,374,386, which is a continuation of application No. 09/897,202, filed on Jul. 2, 2001, now Pat. No. 6,918,731.

(51) Int. Cl.
*H01L 21/677* (2006.01)
*H01L 21/67* (2006.01)

(52) U.S. Cl.
CPC .. *H01L 21/67745* (2013.01); *H01L 21/67201* (2013.01)

(58) Field of Classification Search
CPC ................................. H01L 21/67201
See application file for complete search history.

(56) References Cited

U.S. PATENT DOCUMENTS

| 3,549,674 A | 12/1970 | Joseph et al. |
| 4,816,098 A | 3/1989 | Davis et al. |
| 4,951,601 A * | 8/1990 | Maydan et al. ............... 118/719 |
| 5,482,607 A | 1/1996 | Hashimoto et al. |
| 5,664,925 A | 9/1997 | Muka et al. |
| 5,897,710 A | 4/1999 | Sato et al. |
| 5,989,346 A | 11/1999 | Hiroki |
| 5,997,235 A | 12/1999 | Hofmeister |
| 6,002,971 A | 12/1999 | Lucas |
| 6,045,315 A | 4/2000 | Azumano et al. |
| 6,053,980 A | 4/2000 | Suda et al. |
| 6,059,507 A | 5/2000 | Adams |
| 6,073,366 A | 6/2000 | Aswad |
| 6,126,381 A | 10/2000 | Bacchi et al. |
| 6,142,722 A | 11/2000 | Genov et al. |
| 6,234,107 B1 | 5/2001 | Tanaka et al. |
| 6,275,748 B1 | 8/2001 | Bacchi et al. |

(Continued)

FOREIGN PATENT DOCUMENTS

| JP | 1964-028912 | 1/1989 |
| JP | 05198660 | 5/1992 |

(Continued)

*Primary Examiner* — Saul Rodriguez
*Assistant Examiner* — Willie Berry, Jr.
(74) *Attorney, Agent, or Firm* — Perman & Green, LLP; Colin C. Dunham

(57) ABSTRACT

A load lock is provided for a semiconductor substrate processing system having a transport robot mounted therein. The load lock transport supplies substrates directly to a processing chamber without the need for a central transport robot. The load lock transport is a dual element robot designed for minimum clearance and space and operates within a matching load lock chamber of minimum volume.

16 Claims, 11 Drawing Sheets

(56) References Cited

U.S. PATENT DOCUMENTS

| | | |
|---|---|---|
| 6,326,755 B1 | 12/2001 | Babbs et al. |
| 6,338,626 B1 | 1/2002 | Saeki |
| 6,435,809 B2 | 8/2002 | Goodwin et al. |
| 6,478,484 B1 * | 11/2002 | Singh ............................ 396/611 |
| 6,609,869 B2 | 8/2003 | Aggarwal et al. |
| 6,918,731 B2 | 7/2005 | Talmer |
| 6,969,277 B2 | 11/2005 | Shackelford et al. |
| 6,976,822 B2 | 12/2005 | Woodruff et al. |
| 7,374,386 B2 | 5/2008 | Talmer |
| 7,648,327 B2 | 1/2010 | Bonora et al. |
| 7,669,903 B2 | 3/2010 | Bonora et al. |
| 7,737,567 B2 | 6/2010 | Bonora et al. |
| 7,748,944 B2 | 7/2010 | Price et al. |
| 7,841,820 B2 | 11/2010 | Bonora et al. |
| 8,231,322 B2 | 7/2012 | Talmer |
| 2005/0194096 A1 | 9/2005 | Price et al. |
| 2008/0232934 A1 | 9/2008 | Price et al. |
| 2009/0003976 A1 | 1/2009 | Hofmeister et al. |
| 2009/0016855 A1 | 1/2009 | Hofmeister et al. |
| 2010/0221915 A1 | 9/2010 | Price et al. |
| 2010/0290872 A1 | 11/2010 | Bonora et al. |
| 2010/0290873 A1 | 11/2010 | Bonora et al. |
| 2012/0000816 A1 | 1/2012 | Bonora |

FOREIGN PATENT DOCUMENTS

| | | |
|---|---|---|
| JP | 2005198660 | 8/1993 |
| JP | 2006-029369 | 2/1994 |
| JP | 2006053304 | 2/1994 |
| JP | 2001110874 | 4/2001 |
| JP | 3549674 | 8/2004 |
| WO | WO87/06561 | 11/1987 |

\* cited by examiner

FAST SWAP DUAL SUBSTRATE TRANSPORT FOR LOAD LOCK

CROSS REFERENCE TO RELATED APPLICATIONS

This application is a continuation of and claims priority from U.S. patent application Ser. No. 12/148,346, filed Apr. 18, 2008 (now issued as U.S. Pat. No. 8,231,322) which is a continuation of U.S. patent application Ser. No. 11/104,397, filed Apr. 12, 2005 (now issued as U.S. Pat. No. 7,374,386) which is a continuation of U.S. patent application Ser. No. 09/897,202, filed on Jul. 2, 2001 (now issued as U.S. Pat. No. 6,918,731).

FIELD OF THE INVENTION

This invention relates to the transport of substrates through a load lock which forms part of a semiconductor processing system. The load lock services an individual process chamber.

BACKGROUND OF THE INVENTION

The processing of semiconductors often involves multiple process steps such as the deposit of a film on a substrate or substrate by chemical vapor deposition (CVD), the photo etching of the film, as well as heating, cooling and cleaning.

Each of the process operations is generally performed under vacuum in a specialized process chamber. Because of the need for extreme cleanliness and the delicate nature of each process, batch processing of semiconductor substrates has generally been replaced by individual substrate processing. This allows more control of the processing of each substrate, but limits the overall throughput of the system, because, for each process step, the process chamber must be vented, the substrate loaded, the chamber sealed and pumped to vacuum. After processing, the steps are reversed.

To improve the process volume, a cluster of processing chambers are arranged around a substrate transport chamber which is constructed to be kept under vacuum. One or more load lock chambers are connected through slit valves to the transport chamber.

The load locks accommodate cassettes of substrates to be processed. The cassettes are delivered to the load lock by the front end delivery transport of the system. A load lock constructed to accommodate such cassettes is shown in U.S. Pat. No. 5,664,925 owned in common with the subject application. The disclosure of the '925 patent is incorporated herein by reference, in its entirety.

In this manner cycling times are reduced, while significantly increasing system throughput. The process and transport chambers are maintained continuously under vacuum, while only the load lock is cycled. The load lock receives the substrates to be processed after being sealed from the transport chamber and vented to atmosphere. The front end port is than sealed and the load lock is pumped to a vacuum consistent with the transport and processing chambers.

A robotic transfer mechanism is mounted within the transport chamber and operates to remove substrates from the load lock and deliver them to the selected process chambers. After processing, the substrates are picked up by the robot and transported to the next process chamber or to a load lock for removal from the transport chamber. In some instances, for timing purposes, these systems may employ buffer stations which are adapted to store substrates either before loading or at other times during the transport of the substrate through the system.

A system of this type is described in U.S. Pat. No. 5,882,413 and an example of a robotic transfer mechanism is shown in U.S. Pat. No. 5,647,724, each of which is assigned to an owner common to this application. The disclosures of these patents are incorporated herein by reference in their entirety.

It has been found that substrates up to 200 mm in diameter can be effectively processed with the cluster type systems. However, there is a trend towards increasing diameters and the cluster systems become unduly large when processing substrates of 300 mm or more in diameter. There is a need to provide a more compact process handling module, which is capable of being installed in a side by side relation within a small envelope of space. In addition there is a need for system modules which are more adaptable to the wide variety of process chambers and front end delivery transports.

It is a purpose of this invention to provide a load lock chamber which is constructed to service an individual process chamber directly, without a transport chamber and a transport robot. It is a second purpose of this invention to construct a load lock having its own transfer mechanism. It is another purpose of this invention to provide a transport which will accommodate at least two substrates and allow unloading and loading to and from the front end transport during the process cycle.

SUMMARY OF THE INVENTION

The load lock chamber of a semiconductor processing system is provided with an active transport mechanism for extracting substrates from a buffer station or other delivery means provided by the front end of a system. The load lock transport mechanism has the additional capability of delivering the substrates directly to a processing chamber of the system. The load lock chamber therefore becomes the active transfer robot for the system, as opposed to the more passive transfer passage of prior systems. This allows the use of the load locks of this invention in a wide variety of applications and system configurations. The active transport mechanism provides at least one end effector for picking up and holding substrates for transport. A first buffer shelf may be provided within the load lock to store processed substrates for pickup by the unload mechanism and a second buffer shelf may be provided receive and store unprocessed substrates.

Sealable ports are provided at the processing side and the front end delivery side of the load lock for sequential operation as needed in the process cycle. A front end delivery module locks into the delivery port and delivers a substrate for processing. This is accomplished while the processing port is closed and the load lock is vented to atmosphere.

A substrate is deposited on one of the buffer shelves within the load lock by the front end transfer mechanism or is picked up by the load lock transport from the delivery module and moved into the load lock. After closing and sealing the delivery port, the load lock is pumped to the processing chamber operating vacuum. The processing port is then opened and the substrate is transported to the operating chamber.

During the processing cycle of a substrate, the load lock processing port is closed and the load lock is vented to atmosphere. The delivery port is opened and another substrate is inserted on one of the load lock buffer shelves for processing. The pipe line, namely the load lock, of the system is now filled and the load lock is cycled to vacuum. As soon as the processing cycle is completed, the processed substrate is removed from the processing chamber, moved into the load lock and stored on an empty buffer shelf. An unprocessed substrate is transported into the processing chamber and the effector withdrawn. The processed substrate is stored in the load lock while it is vented and then transferred to the front end transport. A new substrate is loaded into the load lock chamber for processing. To maximize efficiency the cycling of the load lock, including, venting, unloading, loading, sealing, and pumping back to vacuum, occurs while a substrate is being processed. One of the factors which limits the reduction of cycle time is the pumping to vacuum. Since the pumping process is dependent on the volume of the load lock, the interior space of the load lock of this invention is minimized. The interior shape of the load lock chamber is designed according to the motion of the transport to minimize the containment to extension ratio of the load lock system.

Systems and designs of the prior art emphasized elaborate mechanisms in a separate transport chamber and at the front end for loading and unloading the substrates. The load lock merely held a cassette or was constructed with buffer shelves on which the substrates can be loaded and unloaded. The load lock of the prior art performed the function of a conduit to get the substrates to vacuum. In the load lock of this invention, an active robotic transfer mechanism is provided within the load lock to accomplish the needed functions of delivering and picking up the substrates to and from the process chamber.

The front end delivery system is provided with a front end transport capable of delivering the substrates to the load lock. In this instance a substrate shelf within the load lock provides a temporary buffer to receive the substrates from the front end transport. The end effector, therefore, need not extend out of the delivery port, but will load and unload substrates from the buffer shelves.

The transport mechanism is constructed as a modified scara arm consisting of a lower arm and an extended end effector. One end of the lower arm is connected to a drive for rotation about a primary axis. The end effector is pivotally mounted on the free end of the lower arm. The lower arm is driven directly by a first motor of a coaxial drive. The end effector is driven by a second motor of the coaxial drive through a belt and pulley contained within the envelope of the lower arm.

A control algorithm for the drive motors provides a pickup motion in which the end effector is moved to the buffer shelf to acquire a substrate for processing and a drop off motion in which the end effector is moved to extend outward from the processing port to deliver the substrate to the processing chamber. During the pickup motion, the drive motors are controlled to rotate such that the ratio of the angular motion of the second motor to the first drive motor is 2:1. This moves the substrate platform of the end effector in a straight line radially through the primary axis. During the drop off motion, the algorithm directs the controller to rotate the lower arm to allow the end effector to clear the interior walls of the load lock and enter the processing port. To extend the effector into the processing chamber, the drive motors are controlled to move the substrate platform in a straight line through the distal axis of the lower arm. To extract the processed substrate the reverse sequence of motions would be performed.

A Z axis movement, i.e. up and down, may be provided by the transport mechanism within the load lock to provide the required pickup and dropoff motion at the buffer shelves or the processing shelf.

As the end effector pivots over the lower arm, the lower arm is rotated to allow the end effector to clear the processing side wall of the load lock. The end effector continues to pivot until the substrate is aligned with the delivery port of the load lock. A forward motion of the lower arm at this time, extends the end effector through the processing port to deposit a substrate at the process chamber shelf. In this manner the straight line path of the substrate platform in the pick up mode is displaced from the straight line path of the substrate platform in drop off mode. The trajectory of the substrate is adjusted midstream by the drive control algorithm to adjust the position of the lower arm, as indicated above, to provide the displacement.

In an alternate embodiment a second another extended end effector is mounted on the lower arm described above. The second end effector is driven by third drive motor of a triaxial drive system and is controlled for alternating use with first end effector. The second end effector is driven through similar trajectories. When one end effector is in use the other is withdrawn to the back of the load lock chamber. With the use of dual arms, buffer shelves are no longer necessary.

The load lock of this mechanism, in association with its particular transport mechanism, allows the use of a processing port that is offset from the delivery port. This is particular useful when the processing stations are set up in a line, as there are minimum dimensions for separation of the processing stations. When existing front ends are used within, the allowed envelope, the ports may not be aligned. The transport mechanism can accommodate the offset relationship minimizing retrofit design considerations.

DESCRIPTION OF THE DRAWING

The invention is described in more detail below with reference to the attached drawing in which.

DESCRIPTION OF THE PREFERRED EMBODIMENT

Throughout this application the term substrate will be used to refer to planar substrates such as silicon substrates and flat glass panels. This term is meant in its broadest sense.

Figure 1:
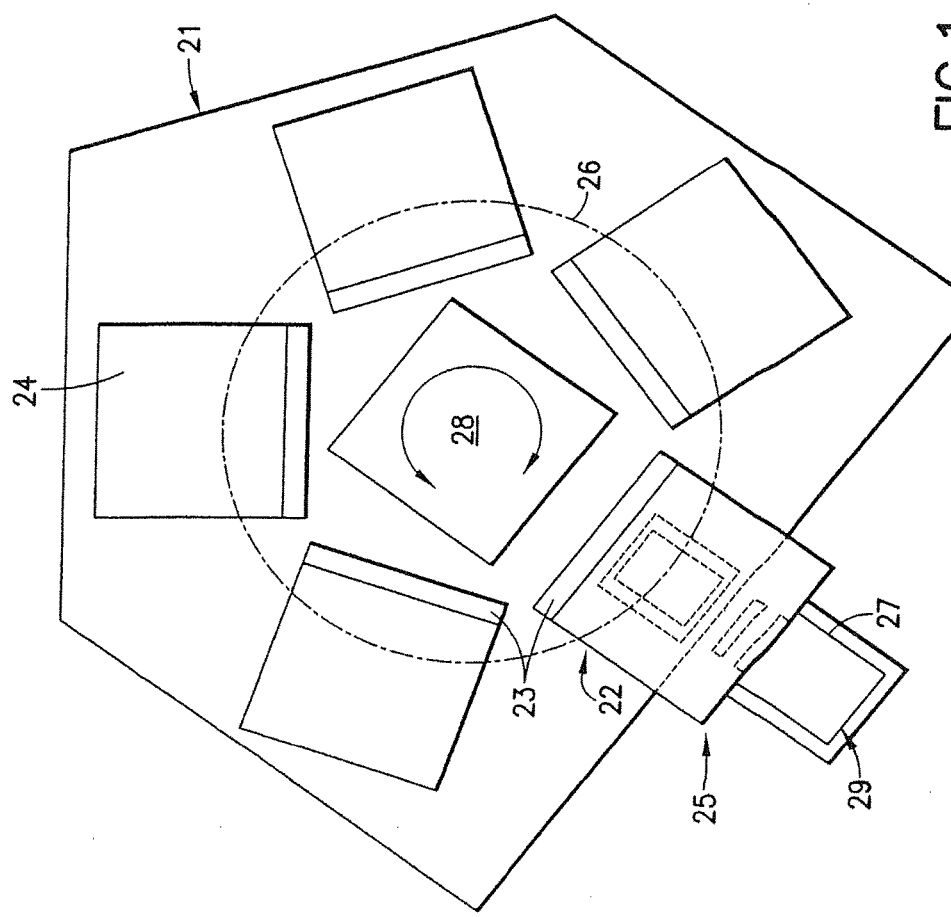
FIG. 1 is a top view of a semiconductor processing system of the prior art.

A semiconductor processing system 21 is shown in FIG. 1 and is generally representative of the state of the art. The system consists of a cluster of processing chambers 24 arranged in a group in communication with a closed transport chamber 26. A transport robot 28 is contained in the transport chamber in operative range of each of the processing chambers 24. The processing chambers 24 and transport chamber 26 form a sealed enclosure which can be pumped down to the required processing vacuum and maintained under vacuum. A front end delivery transport 29 provides cassettes 27 of stacked substrates for processing. A door opening mechanism 25 provides access to load lock 22 through a delivery port. The cassette of substrates is loaded in the load lock at ambient conditions. The load lock 22 is closed at the delivery port by operation of valve 23 so that it can be pumped down to the operating vacuum of the system. The valve 30 is then opened to enable the robot 28 to extract the substrates in sequence for processing. Processing systems of this type have proven very useful and capable of processing large numbers of substrates in a reliable manner. As the size of the substrates has increased in diameter, systems, such as processing system 21, have necessarily become larger to the extent that they have outgrown the space that can be allotted in the production, line for these systems.

Figure 2:
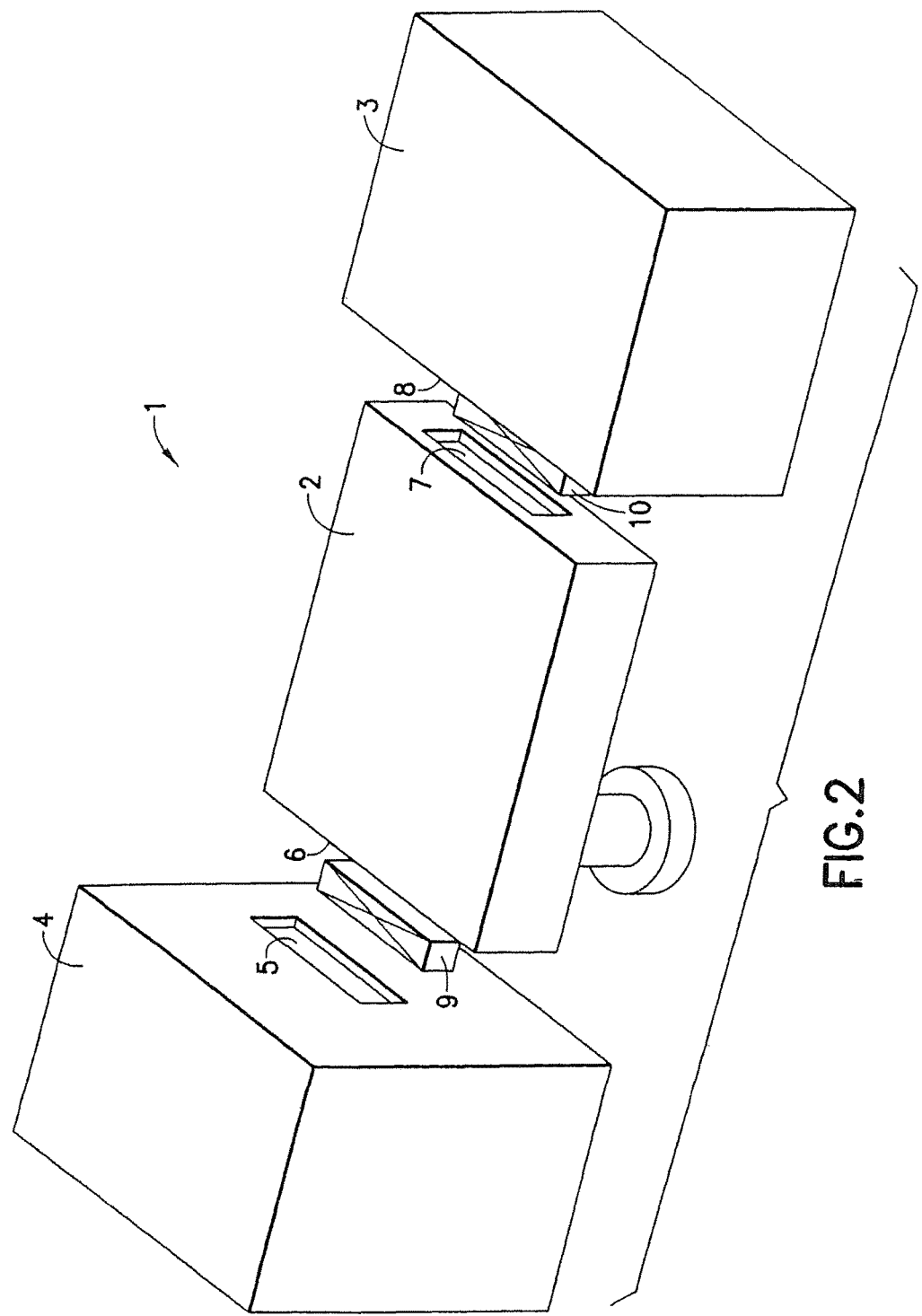
FIG. 2 is a perspective view of the semiconductor processing system of the subject invention.

The processing module 1 of this invention is shown in simple form in FIG. 2 and is constructed of a load lock 2 which serves a single processing chamber 4. The load lock chamber has a processing port 6 and a delivery port 7 to enable the loading of substrates to be processed and the unloading of processed substrates. Ports 6 and 7 are controlled by valves 9 and 10 respectively. A front end delivery system engages valve 10 through an exit port 8. The process chamber is connected to valve 9 through entrance port 5. Substrates are transported by a robot 30, as shown in FIGS. 6a-d, into the load lock 2 by the front end transport 3 under ambient conditions. The load lock is closed, pumped to vacuum and opened to processing chamber 4 through operation of slit valve 9. In this manner the substrates are supplied to the processing chamber using a much more compact system.

Figure 3:
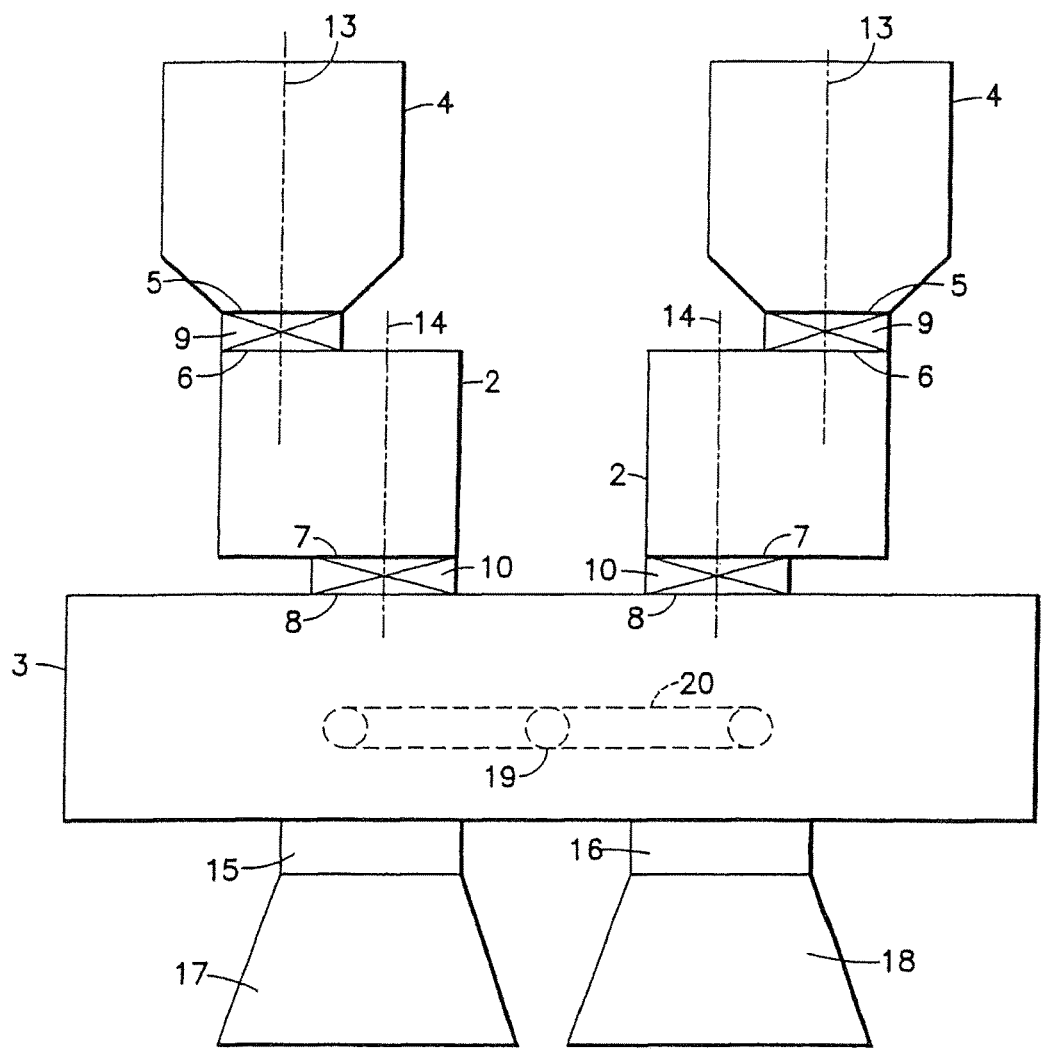
FIG. 3 is a top view of a dual module processing system using the load lock system of this invention.
Figure 4:
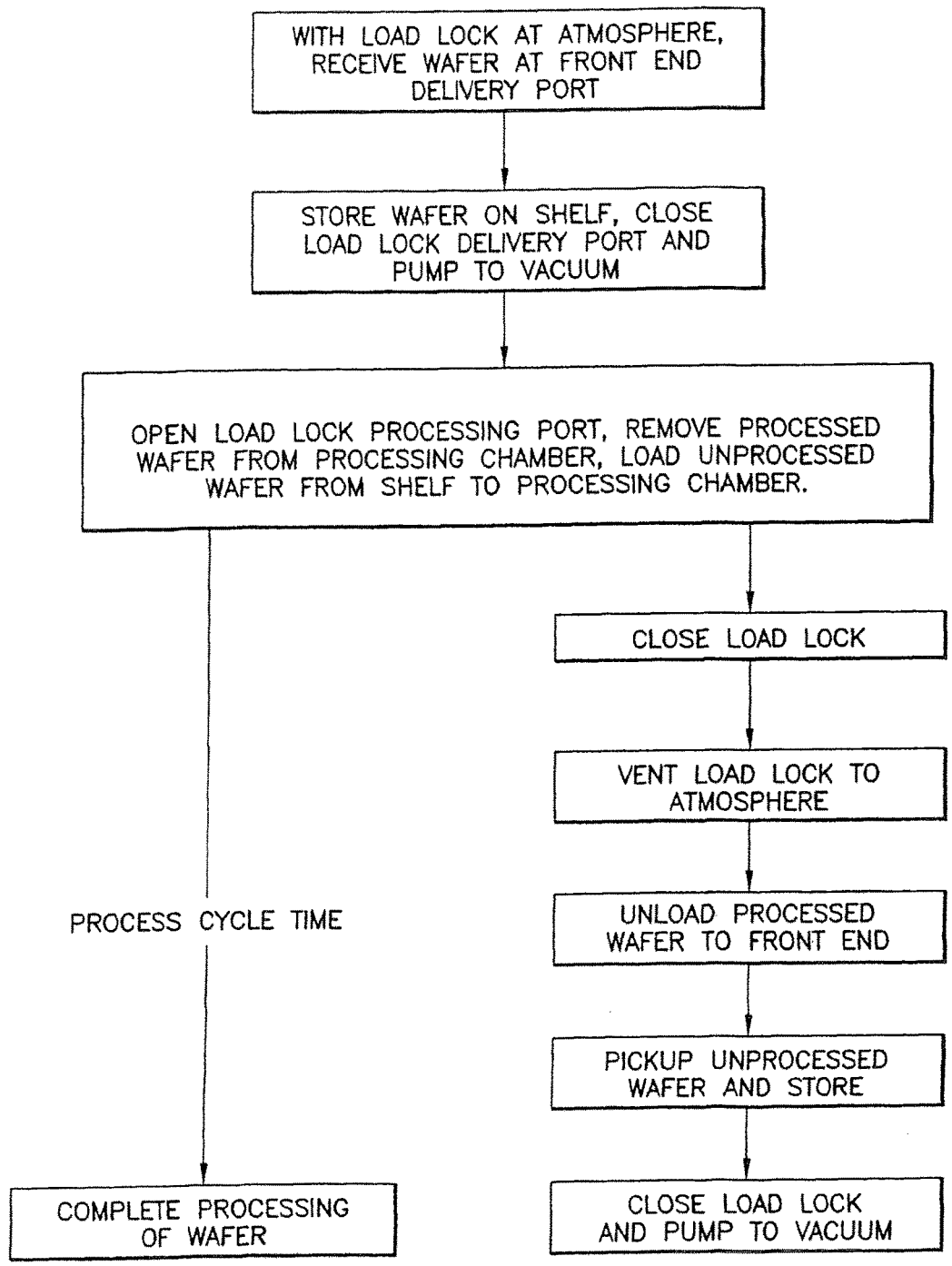
FIG. 4 is a flow chart of the process of this invention.

As shown in FIG. 3, multiple processing modules can be aligned sequentially. According to industry standards the processing chambers 4 must be spaced with a minimum clearance resulting in a separation of the operational paths 13 of the adjacent processing chambers of 750 mm. Existing front end delivery systems which can accommodate the dual processing chambers have operational paths 14 that are 505 mm. apart. The load lock 2 of this invention is designed to accommodate an offset of the operational paths.

The front end delivery system 3 is equipped with door openers 15 and 16 which allow the docking of substrate cassettes 17 and 18. Delivery system 3 includes a robot 19 which may be fixed or mounted on a track 20 depending on the number of docking ports that it serves. A transport of this type is described in commonly owned, U.S. Pat. No. 6,002, 840, the disclosure of which is included in this application in its entirety.

Figure 5:
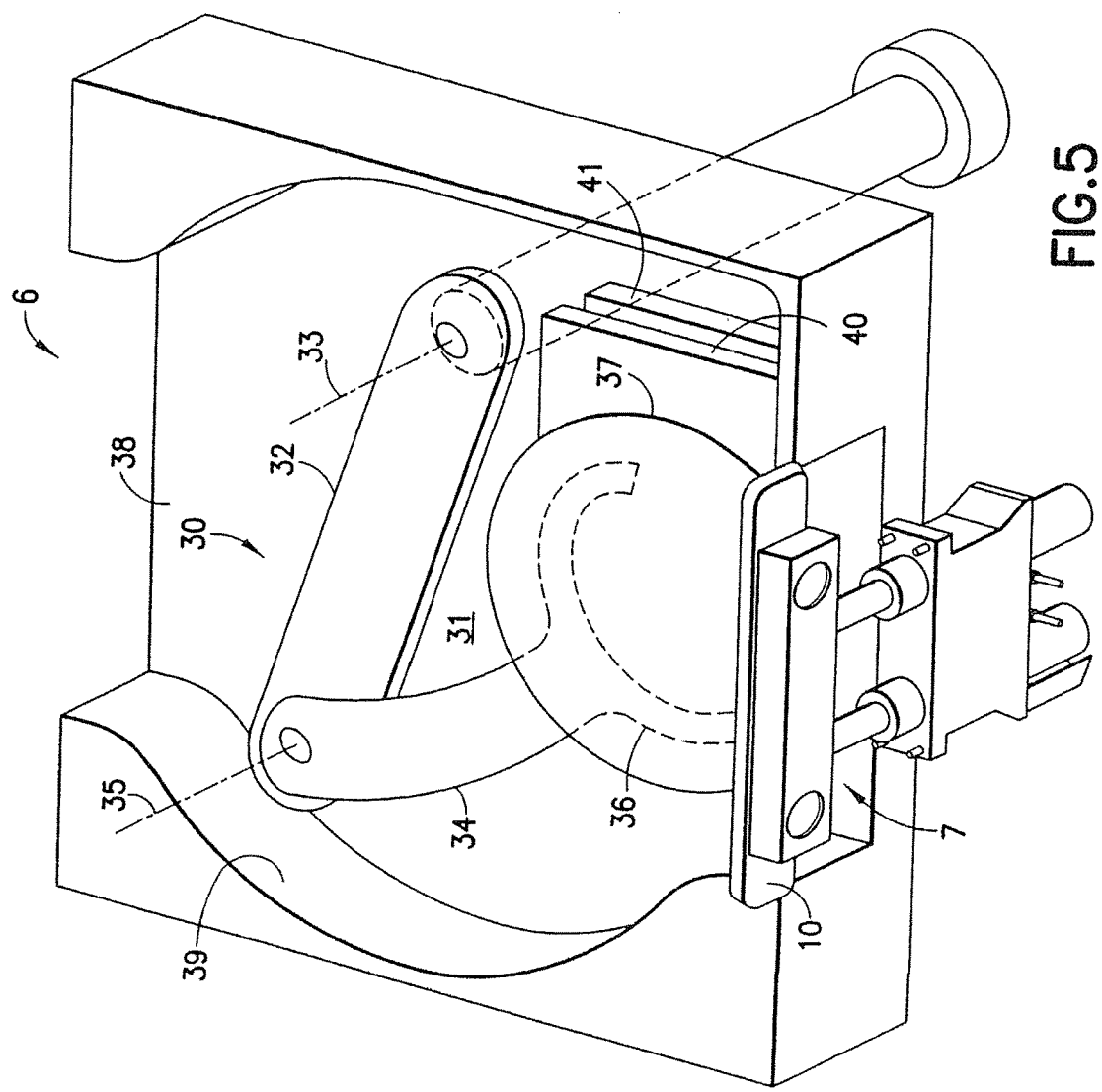
FIG. 5 is an open view of the interior of the load lock of this invention.

The load lock two of this invention is best shown in FIG. 5. Transport 30 is mounted within the cavity 31 of the load lock 2 and consists of a lower arm 32 mounted on an appropriate drive (not shown) for rotation about primary axis 33. An effector 34 is formed as an extended arm and is pivotally attached to the distal end of lower arm 32 for rotation about distal axis 35. The free end of effector 34 is constructed with an appropriate platform 36 designed to receive and support substrates 37.

The operative cavity 31 of load lock 2 is designed to allow only enough space to permit the free operation of the transport 30. By raising the floor 38 to provide only sufficient operating clearance and shaping the interior walls 39 for the same purpose, the volume of the load lock is minimized. This enables the cycling time to vacuum to be reduced in order to provide a cycle time consistent with the processing cycle time.

Figure 7:
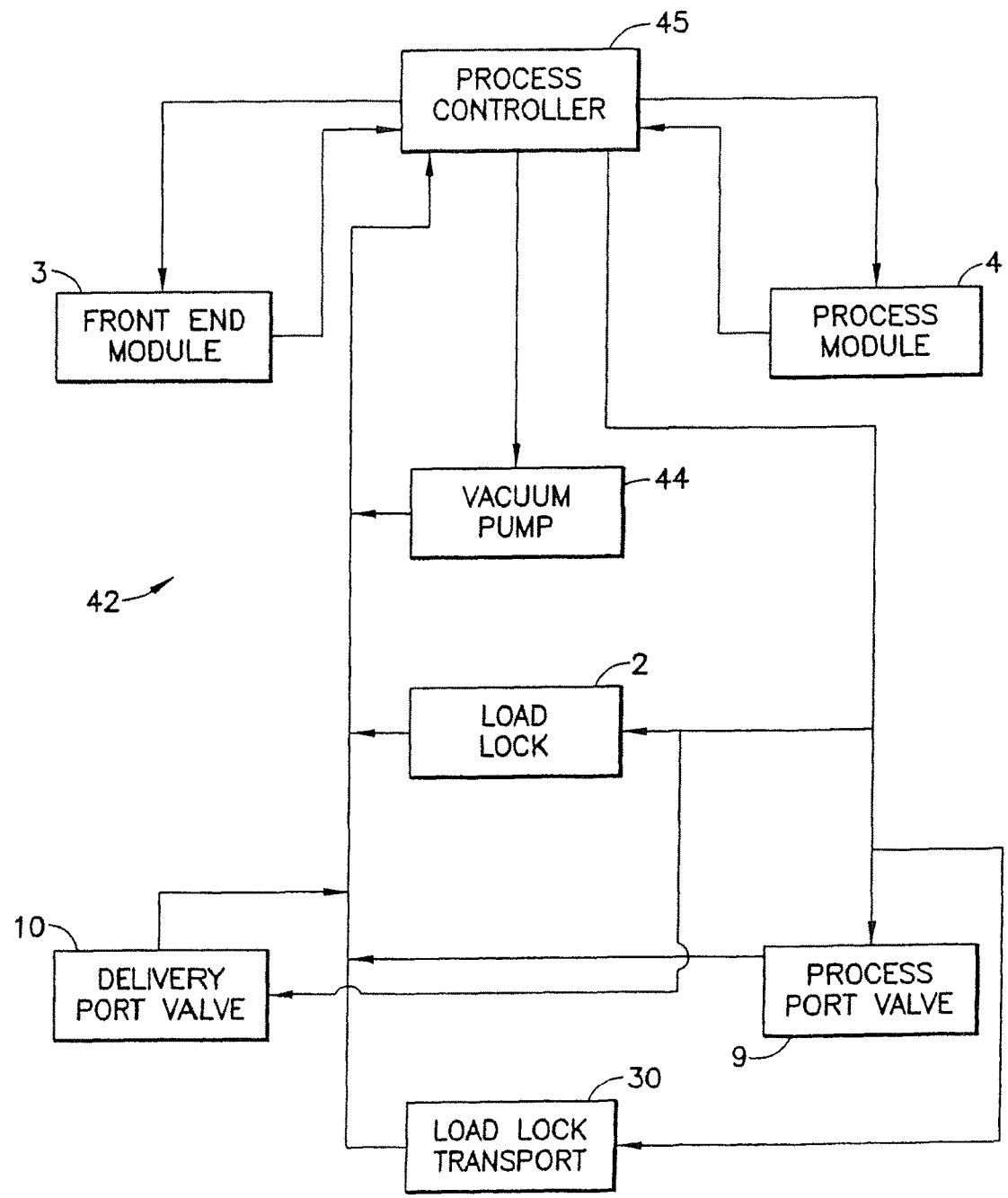
FIG. 7 is a block diagram of the control system for this invention.

Load lock 2 is equipped with a processing port 6 and a delivery port 7 which are controlled respectively by slit valves 9 and 10. The valves are operated by a process control system 42, as shown in FIG. 7. Port 7 allows access to the chamber 31 for front end delivery module 3. Front end delivery module 3 employs a robot 19 to load substrates for processing on buffer shelf 40. End effector 34 is moved by control system 42 into alignment with shelf 40 to pickup substrates such as indicated by reference numeral 37. A second buffer shelf 41 is provided to accommodate processed substrates until they can be removed by front end module 3.

Process control system 42 is shown in FIG. 7 and illustrates a typical system which can be used to accomplish the various functions required in the load lock based substrate processing system of this invention. Each of the process modules will be provided with appropriate sensing elements to feedback information to the control processor to monitor the progress of the process and time the sequence of operational steps.

The principal cycling event is the operation of the vacuum pump 44 to pump the load lock 2 to vacuum. Pump 44 also operates to maintain a vacuum in the operating chamber 4. A pressure monitor senses the pressure in the load lock chamber 31 and provides the system control processor 45 with an indication of load lock pressure. Control processor 45 is controlled by an algorithm for the overall process. As previously indicated, the time needed to pump the load lock to vacuum is dependent on the volume of chamber 31. To minimize the volume of the load lock chamber, all space within the chamber, that is not needed for buffer shelves 40 and 41 and the movement of the transport, is filled by shaping the contour of the top, bottom, and side walls that define the extent of chamber 31. This minimizes the containment to extension ration of the load lock.

Figure 6A:
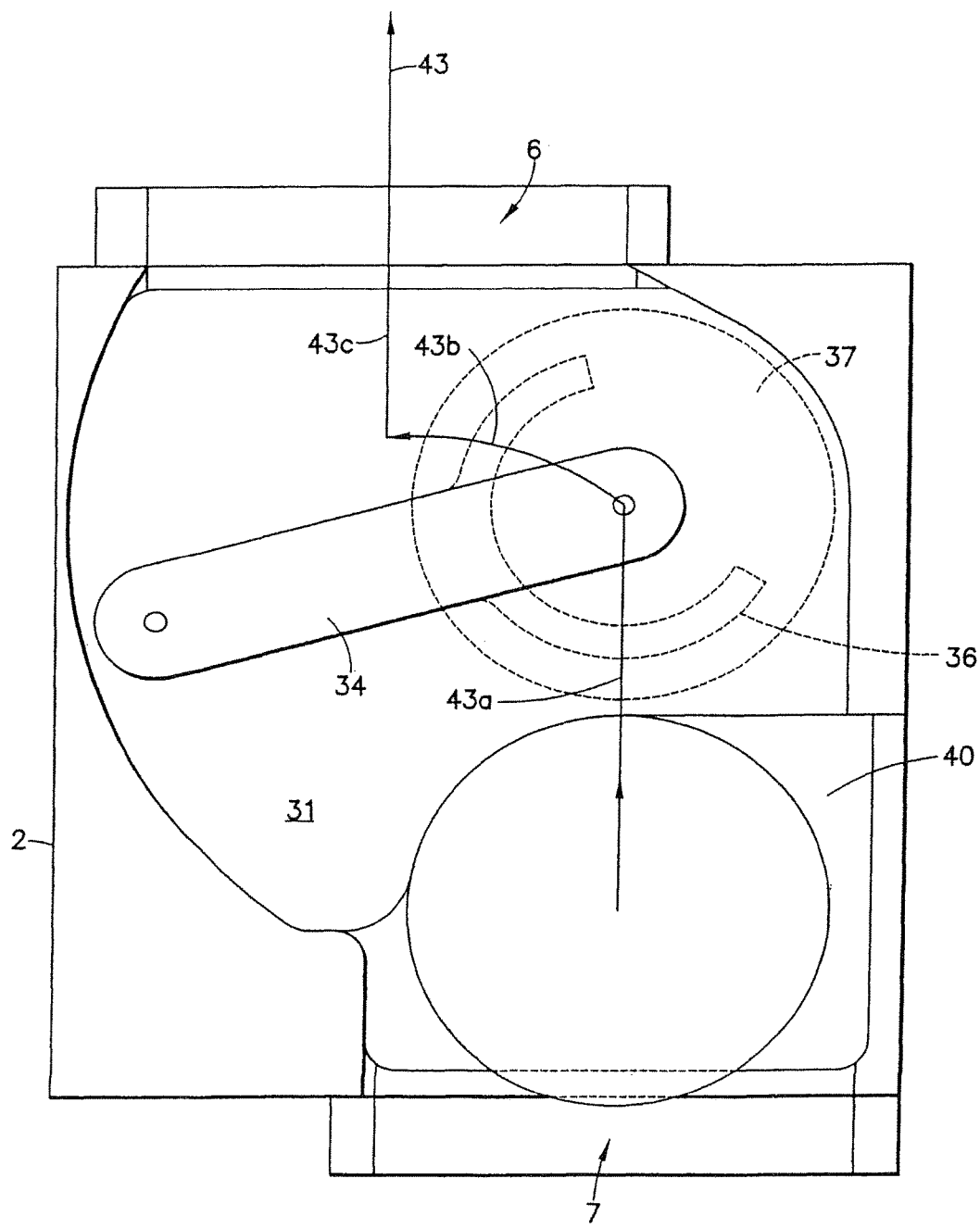
FIGS. 6a-6d are top views of the load lock of this invention showing the movement of the transport mechanism.
Figure 6B:
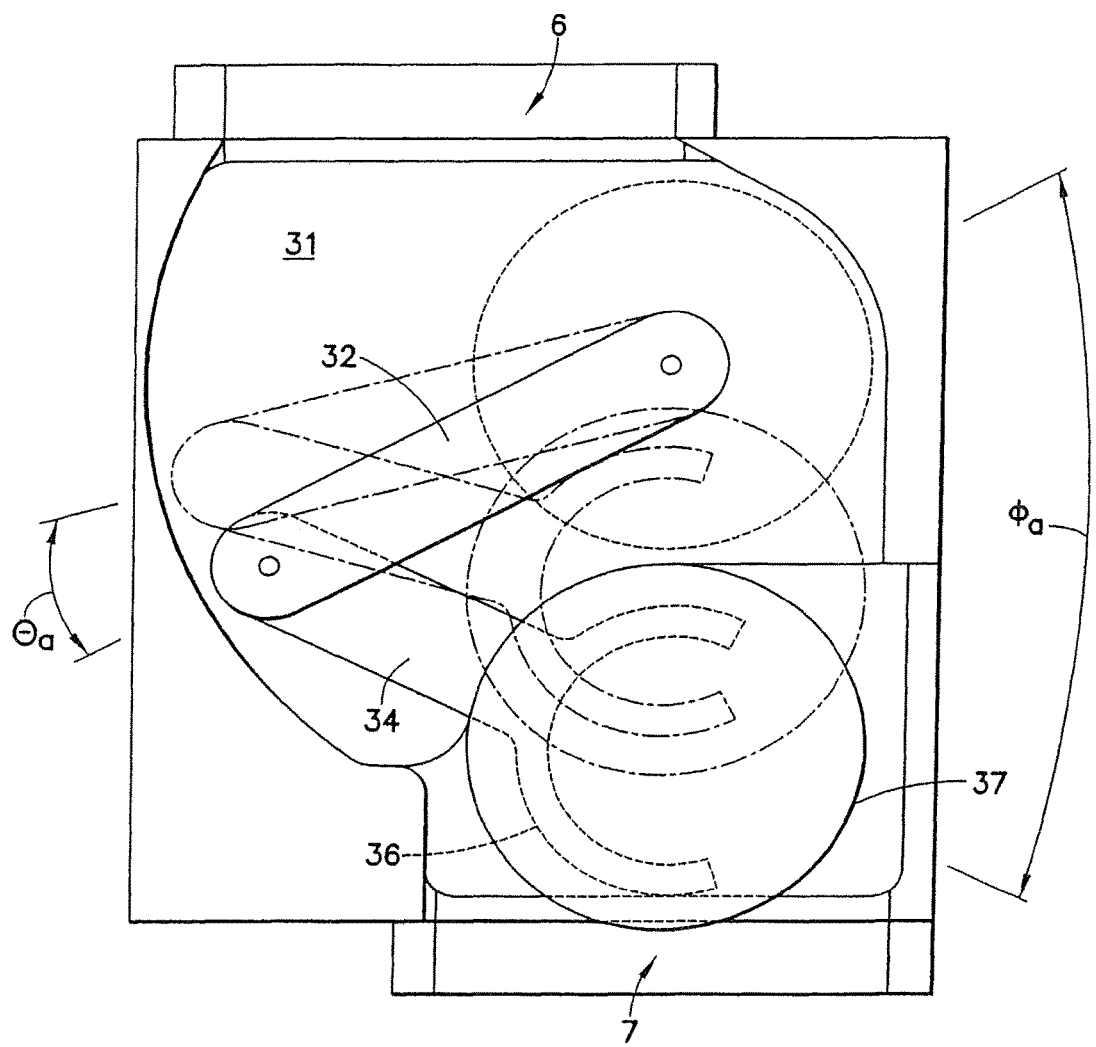
Figure 6C:
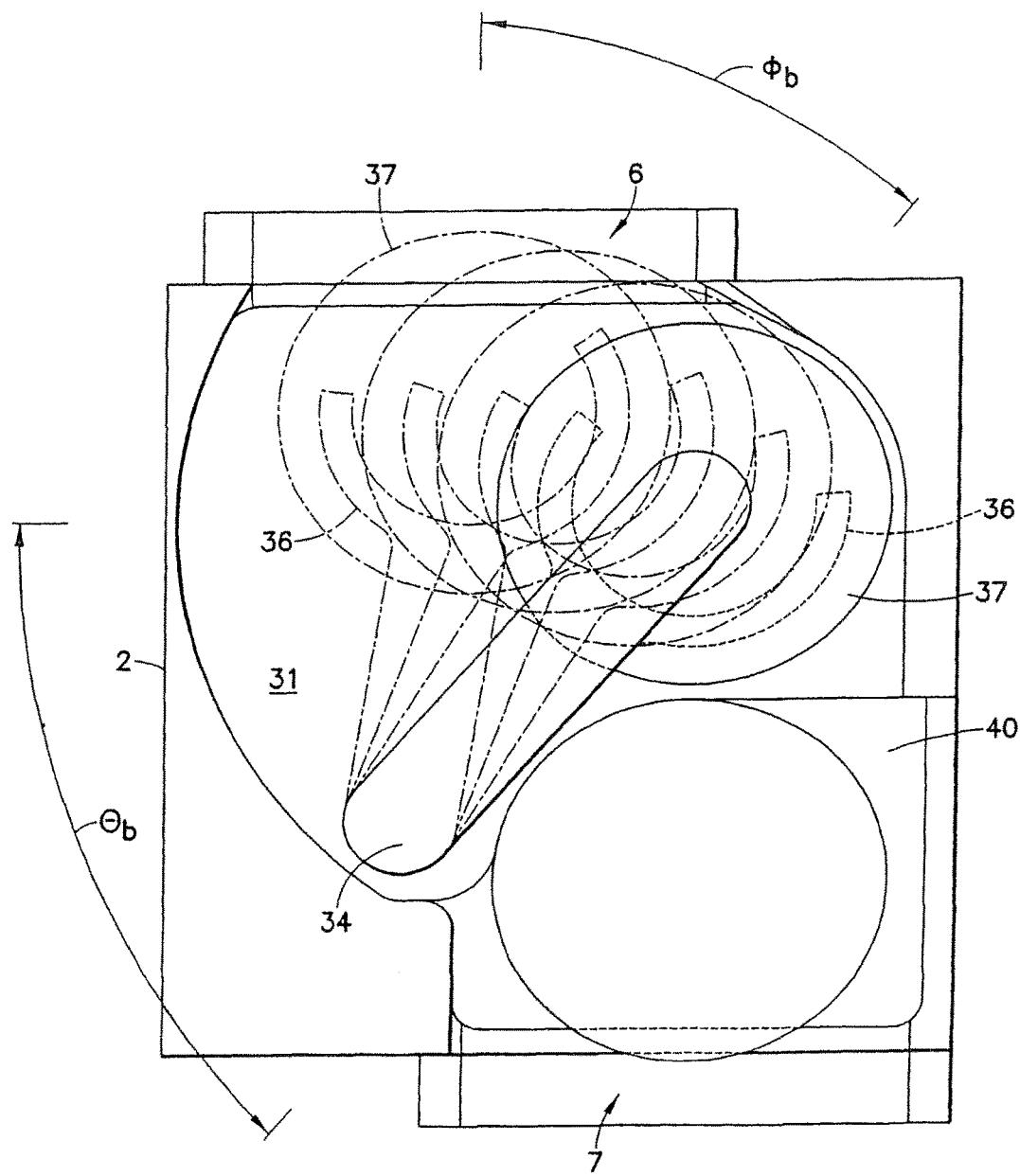
Figure 6D:
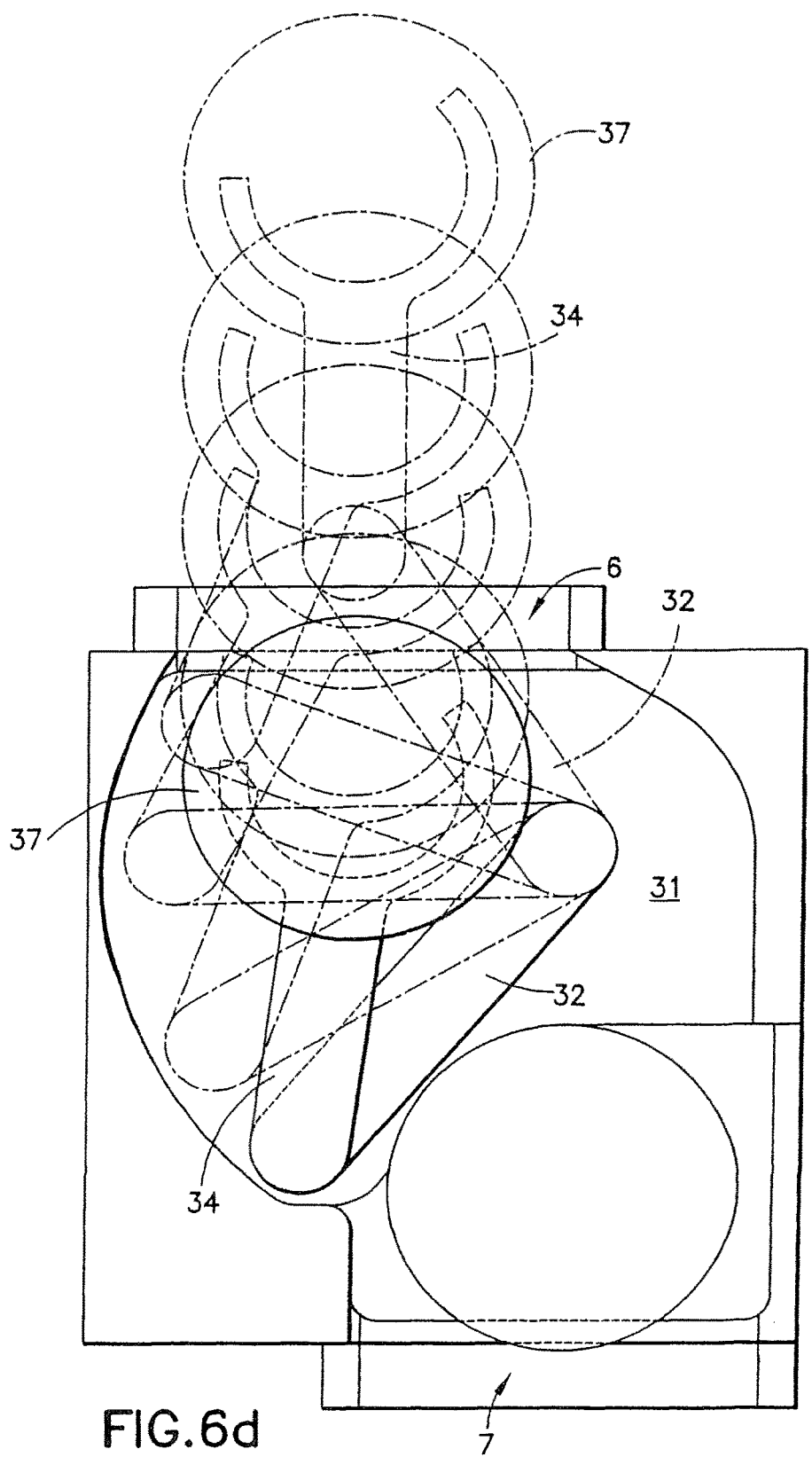

The motion of the transport 30 within the load lock 2 is illustrated in FIGS. 6a-6d. The overall trajectory of the substrate holder 36 is shown by sequence arrow 43. It should be noted that arrow 43 indicates the process loading direction and assumes that substrate 37 is already stored on shelf 40 for processing. The position of the transport in FIG. 6a will be referred to as the start position for convenience. In this position effector 34 is aligned over lower arm 32. In order to move the holder 36 to the pickup position at shelf 40, lower arm 32 is moved through an angle $\theta$ while effector 34 is moved through an angle $\varphi$, as shown in FIG. 6b. The transport drive 46 moves the arms as directed by the control algorithm. The relative motion of effector 34 to lower arm 32 is maintained at a two to one ratio during this motion, thereby generating the straight line trajectory shown by arrow $43_a$. After pickup the transport returns to the start position. Effector arm 34 is then moved into alignment with the process port 6 to allow the extension of the transport into the process chamber 4. This motion is accomplished by rotating lower arm 32 through an angle $\varphi_b$ and by moving effector 34 through angle $\varphi_b$. The control algorithm adjusts the relative motion of lower arm 32 and effector 34 to provide the clearing motion along trajectory portion $43_b$. The transport elements are extended by a two one relative motion to achieve the straight line extension trajectory $43_c$.

Initially load lock 2 is vented and delivery port 7 is open. Front end transport 19 is actuated to deliver a substrate 37 to shelf 40 for processing. Delivery port valve 10 is sealed and load lock chamber 31 is pumped to vacuum. When the process operational vacuum is obtained, the process port 6 is opened through slit valve 9. At this point process chamber 4 is empty and transport 30 is at its so called start position. Transport 30 acquires substrate 37 from buffer shelf 40 and translates through its delivery trajectory 43 to full extension where it will drop off substrate 37 for processing. Transport 30 retracts to its start position and the process valve 9 is closed and sealed. Whereupon substrate 37 is subjected to the process cycle in chamber 4. Simultaneously load lock 2 is vented, opened and receives a new substrate from delivery robot 19. When the new substrate is loaded, delivery valve 10 is closed and the load lock is cycled to vacuum. When the delivery port is opened transport 30 extends, picks up processed substrate 37 and loads it in buffer shelf 41. The system at this point has completed a cycle and a new cycle is initiated to process the new substrate.

Figure 8:
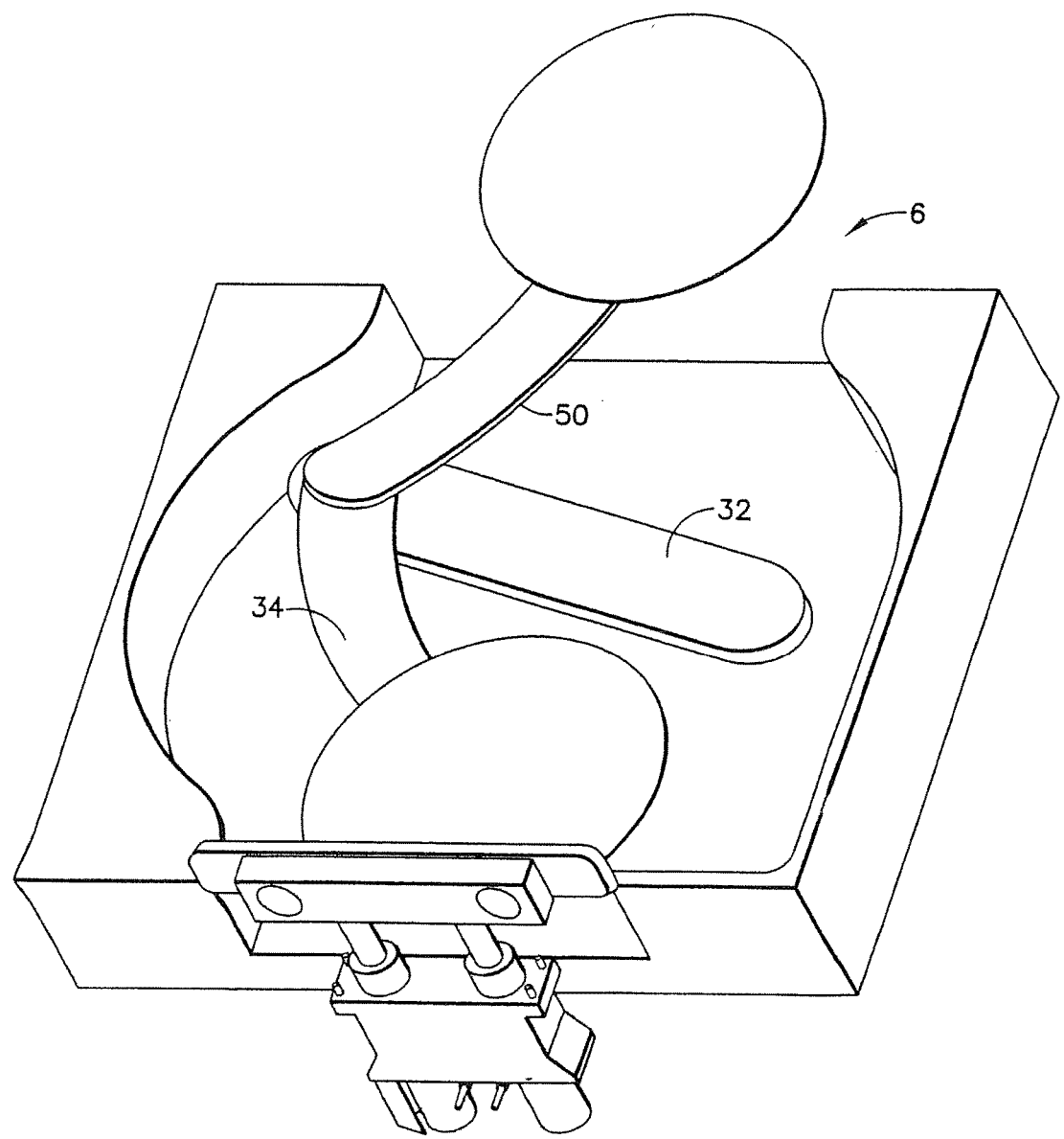
FIG. 8 is an open view of the load lock of this invention showing an alternate embodiment of the transport mechanism.

In the alternate embodiment shown in FIG. 8, a second extended end effector 50 is shown mounted over end effector 34. End effector 50 has a yolk or similar tip at its outer end to receive substrates for transport. Each of the end effectors is driven for alternating use to pickup or drop off substrates as they are processed. The drive mechanism of this requires a triaxial drive to enable each arm to be separately controlled in coordination with the lower arm 32. The second end effector 50 will be moved through a similar trajectory 43 as indicated in FIG. 6a. The additional end effector allows a substrate to be stored without the need for buffer shelves.

In operation, each of the end effectors will initially hold a substrate for processing. After the load lock is pumped to vacuum and with one end effector disengaged in a storage position, a substrate is loaded for processing. After the processing cycle is completed, the processed substrate is picked up by the empty end effector and retracted from the processing chamber. The end effector holding the processed substrate is moved into the storage position while the end effector holding the unprocessed substrate is moved forward. With the processed substrate effector disengaged the lower arm 32 loads the unprocessed substrate for processing. During processing, as before, the load lock is vented and opened to allow a new substrate to be loaded by front end 3. With the second end effector, it would be possible to extend an effector arm out of the load lock to pick up a substrate from a more passive front end system.

In this manner a simplified, highly flexible load lock is constructed to service an individual process chamber. The integral transport mechanism provides a mechanism to deliver substrates to the process chamber and to recycle for the next process cycle during the period of processing. This provides the ability to mount complete process modules to existing front end systems to allow the side by side arrangement of the process modules, thereby avoiding the cumbersome systems which have emerged due to the increase in substrate diameter.

What is claimed is:

1. A processing tool system constructed to supply semiconductor substrates to a process chamber according to a predetermined sequence, the process chamber processing the substrate in a process cycle, the processing tool system comprising:
    a front end delivery module having multiple substrate cassette docks and at least one delivery port;
    a housing having a load lock chamber constructed therein, the load lock chamber having a process port configured for connection to the process chamber and a chamber delivery port configured for connection to the at least one delivery port;
    a first valve for opening and closing the process port according to the predetermined sequence;
    a second valve for opening and closing the chamber delivery port according to the predetermined sequence;
    a pump connected to the housing and arranged for cycling the load lock chamber, with the first and second valves closed between different load lock atmospheres, at least one of which enables opening of the first valve, and at least another of which enables opening of the second valve;
    a transport mounted in the load lock chamber, the transport being configured to move substrates into the process chamber for processing;
    a process controller connected to the process chamber, first and second valves and the transport for controlling the operation thereof in the predetermined sequence;
    wherein the controller is configured to effect a time of the predetermined sequence to cycle the load lock chamber between the different load lock atmospheres within no more than one process cycle of no more than one process chamber; and
    wherein the process port is disposed through a side of the housing such that the process chamber is connected to the load lock chamber through the side of the housing.

2. The processing tool system of claim 1, wherein the transport comprises a coaxial drive.

3. The processing tool system of claim 1, wherein the process port is not in alignment with the chamber delivery port.

4. The processing tool system of claim 1, wherein at least a pair of buffer shelves are disposed in the load lock chamber adjacent to the delivery port and the front end delivery module is configured to pick up and drop off substrates on the pair of buffer shelves.

5. The processing tool system of claim 4, wherein the transport has a pick up trajectory and a drop off trajectory for allowing the transport to operatively service both of the process port and the chamber delivery port, the process controller being configured to move a receiving end of the transport along the pick up trajectory to one of the buffer shelves to acquire a substrate for processing.

6. The process tool system of claim 5, wherein after processing of the substrate is complete, the process controller being configured to move the receiving end along the drop off trajectory into the process chamber to acquire the processed substrate, whereupon the controller effects reverse movement of the receiving end through the drop off trajectory and pick up trajectory to place the processed substrate to one of the buffer shelves.

7. A process tool system constructed to supply semiconductor substrates between two modules of the process tool system according to a predetermined sequence, the process tool system comprising:
    a front end delivery module having at least one substrate cassette dock and at least one delivery port;
    a housing having a load lock chamber constructed therein, the load lock chamber including a first port being configured for connection to a module of the process tool system and a chamber delivery port configured for connection to the at least one delivery port of the front end delivery module;
    a first valve for opening and closing the first port according to the predetermined sequence;

a second valve for opening and closing the chamber delivery port according to the predetermined sequence;

a pump configured to cycle the load lock chamber, with the first and second valves closed, between different load lock atmospheres, at least one of which enables opening of the first valve and at least another of which enables opening of the second valve;

a transport mounted in the load lock chamber, the transport being configured to move substrates between the module and the front end delivery module for processing; and a controller connected to the load lock chamber and being configured to control the operation of at least one of the first and second valves, the transport and the pump such that the controller effects the predetermined sequence timed to cycle the load lock chamber between the different load lock atmospheres within no more than one process cycle of no more than one of the module of the process tool system.

8. The processing tool system of claim 7, wherein the transport comprises a coaxial drive.

9. The processing tool system of claim 7, wherein the first port is not in alignment with the chamber delivery port.

10. A substrate processing tool comprising:

a front end delivery module having at least one substrate cassette dock and at least one delivery port;

a housing defining a substrate holding chamber capable of holding an isolated cycleable atmosphere therein for enabling substrate transport between at least two different atmospheres, the housing having at least two substantially parallel opposing walls that bound the isolated cycleable atmosphere held by the substrate holding chamber and being configured for connection between the front end delivery module and a second module of the substrate processing tool, the substrate holding chamber including a first port configured for connection to the at least one delivery port of the front end delivery module and a second port configured for connection to the second module, where each of the first port and second port are respectively included into a respective one of the at least two substantially parallel opposing walls of the housing such that the first port is included into a first wall of the substantially parallel opposing walls, and the second port is included into a second wall of the substantially parallel opposing walls and the first port and the second port substantially oppose each other so that substrates transferred respectively through the first port and second port are transferred along respectively a first linear transport path crossing from the housing extending through the first port into the substrate holding chamber and a second linear transport path crossing from the substrate holding chamber through the second port into the second module, wherein the first linear transport path crossing from the substrate housing extending through the first port into the substrate holding chamber and the second linear transport path crossing from the substrate holding chamber through the second port to the second module are substantially linearly parallel paths both between the at least substantially parallel opposing walls and each respective crossing of the corresponding first and second linear transport paths through the corresponding first and second ports;

a first valve for opening and closing the first port according to a predetermined sequence;

a second valve for opening and closing the second port according to the predetermined sequence; and a transport mounted in the substrate holding chamber, the transport being configured to move the substrates between the front end delivery module and the second module for processing.

11. The processing tool system of claim 10, wherein the transport comprises a coaxial drive.

12. The processing tool system of claim 10, wherein the second port is not in alignment with the first port.

13. The processing tool system of claim 10, further comprising:

a substrate buffer located adjacent the first valve or the second valve, the substrate buffer being configured to hold one or more substrates; and wherein the transport is configured to access the substrate buffer and move substrates into the front end delivery system or the second module for processing.

14. A substrate processing apparatus constructed to supply semiconductor substrates to a process chamber according to a predetermined sequence, the process chamber processing the substrate in a process cycle, the substrate processing apparatus comprising:

a front end delivery module having at least one substrate cassette dock and at least one delivery port;

a housing having a load lock chamber constructed therein, the load lock chamber including a process port configured for connection to the process chamber and a chamber delivery port configured for connection to the at least one delivery port, the load lock chamber being configured to cycle an isolated atmosphere within the load lock chamber between the atmospheres of the process chamber and the front end delivery module;

a first valve for opening and closing the process port according to the predetermined sequence;

a second valve for opening and closing the chamber delivery port according to the predetermined sequence;

a transport mounted in the load lock chamber, the transport being configured to move substrates into the process chamber for processing; and a controller connected to the load lock chamber and being configured to control the operation of at least one of the first and second valves and the transport such that the controller effects the predetermined sequence timed to cycle the isolated atmosphere within load lock chamber between the atmospheres of the process chamber and the front end delivery module within no more than one process cycle of no more than one process chamber.

15. The processing tool system of claim 14, wherein the transport comprises a coaxial drive.

16. The processing tool system of claim 14, wherein the process port is not in alignment with the chamber delivery port.

* * * * *